US008399346B2

(12) United States Patent
Yess et al.

(10) Patent No.: US 8,399,346 B2
(45) Date of Patent: Mar. 19, 2013

(54) SCRATCH-RESISTANT COATINGS FOR PROTECTING FRONT-SIDE CIRCUITRY DURING BACKSIDE PROCESSING

(75) Inventors: Kimberly A. Yess, St. James, MO (US); Madison M. Daily, Jr., Rolla, MO (US); Tony D. Flaim, St. James, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 12/882,465

(22) Filed: Sep. 15, 2010

(65) Prior Publication Data

US 2011/0062604 A1    Mar. 17, 2011

Related U.S. Application Data

(60) Provisional application No. 61/242,846, filed on Sep. 16, 2009.

(51) Int. Cl.
*H01L 21/00* (2006.01)
(52) U.S. Cl. ......... 438/597; 438/692; 438/706; 438/778
(58) Field of Classification Search .......... 438/780–781, 438/597, 692, 706, 745, 778
See application file for complete search history.

(56) References Cited

U.S. PATENT DOCUMENTS

| | | | |
|---|---|---|---|
| 3,468,834 A | 9/1969 | Oda et al. | |
| 6,551,905 B1 * | 4/2003 | Barsky et al. | 438/459 |
| 7,316,844 B2 | 1/2008 | Li et al. | |
| 7,758,913 B2 | 7/2010 | Li et al. | |
| 2001/0032568 A1 | 10/2001 | Schutt | |
| 2001/0036689 A1 * | 11/2001 | Muroyama | 438/149 |
| 2002/0064965 A1 | 5/2002 | Wu | |
| 2004/0031977 A1 | 2/2004 | Brown et al. | |
| 2005/0085008 A1 * | 4/2005 | Derderian et al. | 438/106 |
| 2005/0158538 A1 | 7/2005 | Li et al. | |
| 2007/0075309 A1 | 4/2007 | Zhong et al. | |
| 2007/0276100 A1 * | 11/2007 | Cupta et al. | 525/452 |
| 2009/0075087 A1 * | 3/2009 | Xu et al. | 428/413 |

OTHER PUBLICATIONS

International Search Report and Written Opinion dated May 23, 2011, in corresponding PCT/US2010/048899 filed Sep. 15, 2010.
Office Action dated Aug. 23, 2011 in related U.S. Appl. No. 11/856,552 filed Sep. 17, 2007.
Office Action dated Sep. 24, 2009 in related U.S. Appl. No. 11/428,123 filed Jun. 30, 2006.
Spencer et al., "Polymer protective coating for wet deep silicon etching processes," Proc. of SPIE, 2003, vol. 4979, pp. 79-86.
Bodas et al., "PMMA as an etch mask for silicon micromachining—a feasibility study," J. Indian Inst. Sci., 2001, 81, 645-651.
Ledermann et al., "Sputtered silicon carbide thin films as protective coating for MEMS applications," Surface and Coatings Technology, 2000, 125, 246-250.
Solvay Advanced Polymers Design Guide (Radel, Acudel, and Veradel), 2004, pp. 1-59.
Radel polyethersulfone Product Data, Solvay Advanced Polymers, 2008, pp. 1-2.
Brewer Science Press Release: ProTEK SR "Scratch-Resistant Solution for DRIE Processes," Jun. 19, 2009.
LanXess Energizing Chemistry, Lustran SAN Sparkle Data Sheet, 2005, pp. 1-2.

*Primary Examiner* — Richard A. Booth
(74) *Attorney, Agent, or Firm* — Hovey Williams LLP

(57) ABSTRACT

Scratch-resistant coatings for protecting front-side microelectromechanical and semiconductor device features during backside processing are provided, along with methods of using the same. The coatings are non-photosensitive, removable, and tolerate high processing temperatures. These coatings also eliminate the need for a separate etch stop layer in the device design. The coatings are formed from a composition comprising a component dissolved or dispersed in a solvent system. The component is selected from the group consisting of styrene-acrylonitrile copolymers and aromatic sulfone polymers.

19 Claims, 5 Drawing Sheets

(A)

(B)

(C)

| Ions | Upper Spec Limit | Upper Control Limit | Std Dev | Average | Cp | Cpk |
|---|---|---|---|---|---|---|
| Aluminum | 10000 ppb | 5.50 | 1.12 | 2.14 | 2973.25 | 2973.25 |
| Calcium | 10000 ppb | 20.98 | 4.48 | 7.56 | 744.28 | 744.28 |
| Chromium | 10000 ppb | 7.84 | 1.95 | 2.01 | 1712.38 | 1712.38 |
| Copper | 10000 ppb | 6.68 | 1.69 | 1.63 | 1977.90 | 1977.90 |
| Iron | 10000 ppb | 13.92 | 3.04 | 4.79 | 1095.37 | 1095.37 |
| Magnesium | 10000 ppb | 15.76 | 3.80 | 4.37 | 877.45 | 877.45 |
| Manganese | 10000 ppb | 2.08 | 0.49 | 0.59 | 6737.93 | 6737.93 |
| Potassium | 10000 ppb | 4.84 | 1.13 | 1.44 | 2948.41 | 2948.41 |
| Sodium | 10000 ppb | 33.24 | 8.02 | 9.18 | 415.31 | 415.31 |

SCRATCH-RESISTANT COATINGS FOR PROTECTING FRONT-SIDE CIRCUITRY DURING BACKSIDE PROCESSING

CROSS-REFERENCE TO RELATED APPLICATIONS

The present application claims the benefit of and priority from U.S. Provisional Patent Application Ser. No. 61/242,846, SCRATCH-RESISTANT COATINGS FOR PROTECTING FRONT-SIDE CIRCUITRY DURING BACKSIDE PROCESSING, filed Sep. 16, 2009, the entire disclosure of which is hereby incorporated by reference herein.

BACKGROUND OF THE INVENTION

1. Field of the Invention

The present invention provides organic, spin-applied, scratch-resistant coatings for protection of fragile front-side circuitry from damage during backside fabrication and packaging processes.

2. Description of Related Art

Deep reactive ion etching (DRIE) fabrication is utilized in many microelectromechanical fabrication processes. For example, the demand for flexible microelectromechanical systems (MEMS) requiring tall structure designs, as well as the increased density and performance expectations from the integrated circuit (IC) industry, are driving the need to utilize DRIE in creating deep anisotropic etches of silicon for MEMS and semiconductor device applications. However, during the process, the fragile, etch-sensitive circuitry already constructed on the front side of the wafer is susceptible to damage, both physically due to direct contact with the chuck of the etch chamber, and chemically during the etching process.

Typically, a standard photoresist has been used as a DRIE protective coating. Such material, however, is incapable of providing the necessary plasma- or scratch-resistance and is also known to have problems with material outgassing and stress-related issues. In addition, photoresists generally cannot survive the necessary 110° C. operating temperatures of DRIE. Existing technologies have also relied upon a separate aluminum, $SiO_2$, or aluminum oxide etch stop layer in the device design, but such materials cannot be later removed from the device and thus, must be incorporated into the overall device design. They can also affect the underlying layers, causing device yield loss.

Thus, there is a need in the art for protective coatings that provide the required scratch resistance, while also avoiding the drawbacks of existing coatings. Such materials should not contaminate the etch chamber or tool, avoid outgassing during the etch process, have sufficient hardness to resist physical scratching, avoid any tendency to reflow under temperature conditions of the etch process, and be able to sufficiently cover the device circuitry and planarize its topography without any stress on the device features. Such material should be easily removed after the etch process without any damage or negative effects to the circuitry or the substrate itself. Finally, such material should also be suitable to act as an etch stop layer to avoid the need for a separate layer in the device design.

SUMMARY OF THE INVENTION

The present invention overcomes these problems by providing a method of protecting front-side device features during backside processing utilizing a protective coating meeting the above requirements. The method comprises providing a substrate having a device surface and a backside surface. One or more intermediate layers can optionally be formed on the device surface. A non-photosensitive protective layer is formed on the intermediate layers if present, or on the device surface if no intermediate layers are present, and the backside surface is subjected to backside processing. The protective layer is formed from a composition comprising a component dispersed or dissolved in a solvent system, wherein the component is selected from the group consisting of styrene-acrylonitrile copolymers and aromatic sulfone polymers.

The invention also provides a structure comprising a substrate having a device surface and a backside surface, wherein the device surface comprises device features. A removable, non-photosensitive protective layer is adjacent the device surface, wherein no intermediate layers are present between the device surface and the protective layer. The protective layer is formed from a composition comprising a component dispersed or dissolved in a solvent system, wherein the component is selected from the group consisting of styrene-acrylonitrile copolymers and aromatic sulfone polymers.

DETAILED DESCRIPTION

Figure 1:
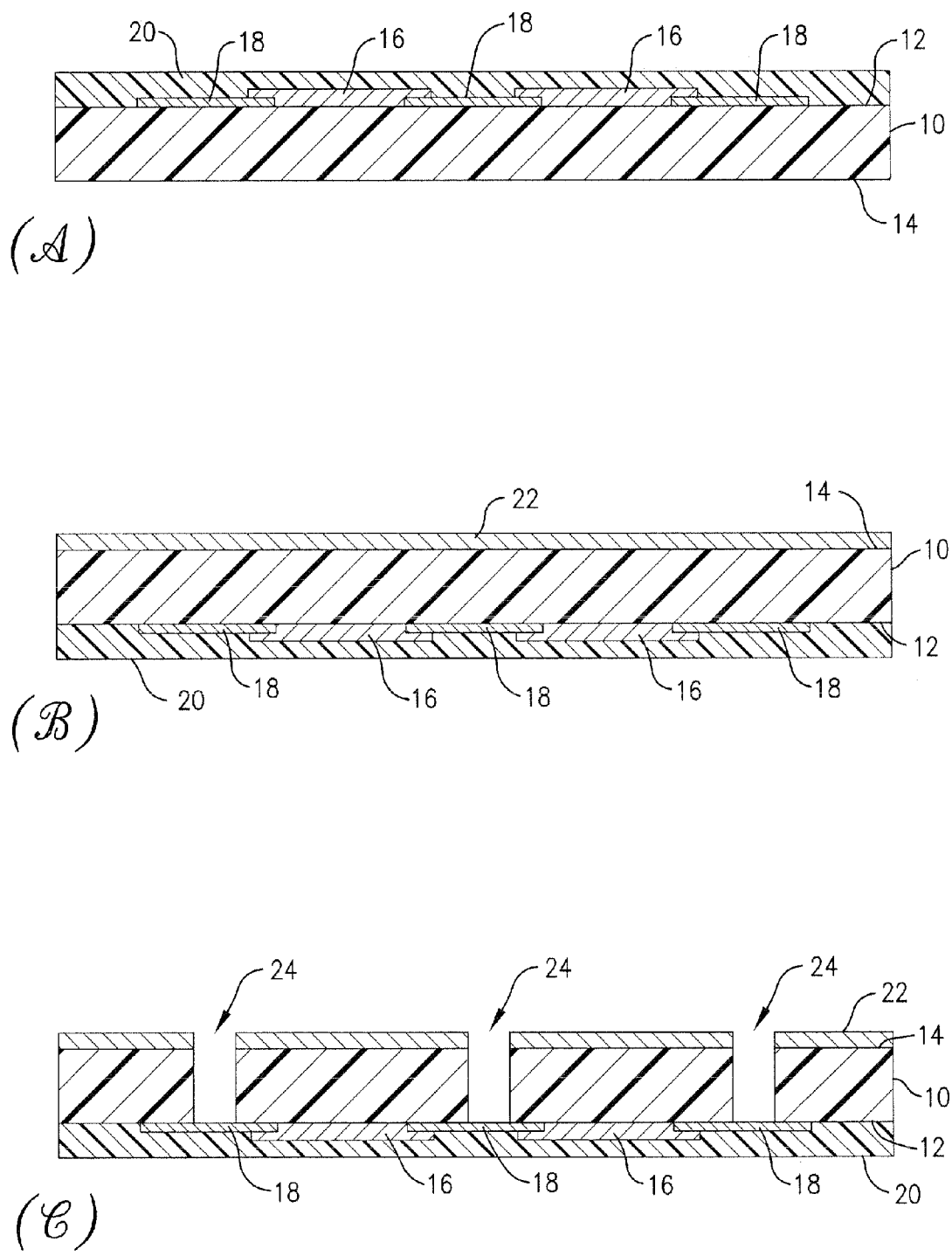
FIGS. 1(A)-(C) is a schematic depicting a process flow of using the protective coating to protect front-side device features during backside processing.

The scratch-resistant protective coating compositions comprise a component dispersed or dissolved in a solvent system. In one embodiment, the component is a styrene-acrylonitrile copolymer, and the composition thus comprises a styrene-acrylonitrile copolymer dispersed or dissolved in a solvent system. Preferred copolymers are thermoplastic polymers and comprise recurring monomers having the formulas

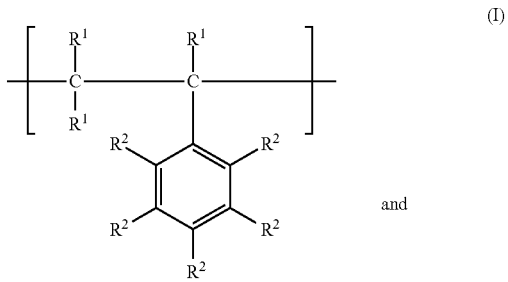

and

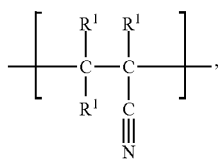

(II)

where:

each $R^1$ is individually selected from the group consisting of —H and $C_1$-$C_8$ (and preferably $C_1$-$C_4$) alkyls, with methyl being preferred; and each $R^2$ is individually selected from the group consisting of —H, $C_1$-$C_8$ (and preferably $C_1$-$C_4$) alkyls, and $C_1$-$C_8$ (and preferably $C_1$-$C_4$) alkoxys.

The copolymer preferably comprises at least about 50% by weight of monomer (I), more preferably from about 50% to about 80% by weight of monomer (I), and even more preferably from about 65% to about 78% by weight of monomer (I), based upon the total weight of the copolymer taken as 100% by weight. The copolymer preferably comprises at least about 15% by weight of monomer (II), more preferably from about 15% to about 45% by weight of monomer (II), and even more preferably from about 20% to about 35% by weight of monomer (II), based upon the total weight of the copolymer taken as 100% by weight. In some aspects, the copolymer preferably consists essentially (or even consists) of recurring monomers (I) and (II). That is, the copolymer can be substantially free of other co-monomers. Copolymers of styrene and acrylonitrile, some of which are known as SAN engineering thermoplastics, are among the best candidates for use in forming the protective coatings. The number average molecular weight of the copolymer is preferably from about 30,000 to about 400,000 Daltons, and more preferably from about 120,000 to about 180,000 Daltons.

In other aspects, monomers other than monomers (I) and (II) can also be present in the copolymer, if desired. When other monomers are present, the combined weight of monomers (I) and (II) in the copolymer is preferably at least about 60% by weight, and more preferably from about 60-99% by weight, based upon the total weight of the copolymer taken as 100% by weight. Examples of suitable other co-monomers include alkyl (meth)acrylates (such as methyl or butyl (meth)acrylate), α-methyl styrene, vinyl toluene, maleic anhydride, and combinations thereof. Some exemplary co-monomers are selected from the group consisting of:

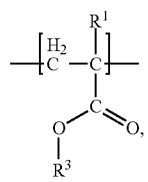

(III)

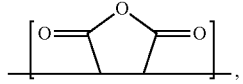

(IV)

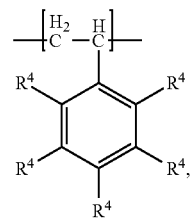

(V)

and combinations thereof.

where:

each $R^1$ is defined as above;

each $R^3$ is individually selected from the group consisting of —H, $C_1$-$C_{10}$ (and preferably $C_1$-$C_4$) alkyl groups (e.g., methyl, ethyl, butyl, 2-ethylhexyl, isodecyl, isobornyl), alkylaryl groups (e.g., benzyl), and aryl groups (e.g., phenyl); and each $R^4$ is individually selected from the group consisting of —H and alkyls (preferably $C_1$-$C_4$).

In the instance of functional groups derived from carboxylic acids such as esters or anhydrides, it is important that the corresponding monomer concentration in the thermoplastic copolymer be less than about 20% by weight, and preferably less than about 10% by weight to limit the possibility of hydrolysis and consequent dissolution or swelling of the protective coating by basic etchants. Additional suitable styrene-acrylonitrile-based copolymer compositions are disclosed in U.S. Pat. No. 7,316,844, incorporated by reference herein to the extent not inconsistent with the present description.

The protective composition is formed by dispersing or dissolving the copolymer in a solvent system. The solvent system utilized in the composition should have a boiling point of from about 100 to about 220° C., and preferably from about 140 to about 180° C. The solvent system should be utilized at a level of from about 60 to about 95% by weight, preferably from about 65 to about 90% by weight, and more preferably from about 70 to about 85% by weight, based upon the total weight of the composition taken as 100% by weight. The total solids in the composition is preferably from about 5 to about 40% by weight, more preferably from about 10 to about 35% by weight, and even more preferably from about 15 to about 30% by weight, based upon the total weight of the composition taken as 100% by weight. Suitable solvent systems will comprise a solvent selected from the group consisting of ketones, esters, glycol ethers, aromatic hydrocarbons, ethers, and mixtures thereof. Especially preferred solvents within these categories include cyclohexanone, cyclopentanone, propylene glycol monomethyl ether acetate (PGMEA), anisole, xylene and higher aromatic solvents, ethyl lactate, ethyl 3-ethoxypropionate (EEP), diethylene diglycol dimethyl ether, methyl isoamyl ketone (MIAK), ethyl acetoacetate (EAA), and mixtures thereof. The copolymer should be included in the composition at a level of from about 5 to about 40% by weight, preferably from about 10 to about 35% by weight, and even more preferably from about 15 to about 30% by weight, based upon the total weight of the composition taken as 100% by weight. It will be appreciated that the copolymer solids level can be varied depending on the copolymer molecular weight, desired solution viscosity, and solvent type. Although other ingredients can be dispersed or dissolved in the solvent system with the copolymer, in some aspects, it is preferred that the composition consist essentially (or even consist) of the copolymer dispersed or dissolved in the solvent system. Thus, the composition will preferably comprise from about 90 to about 98% by weight copolymer, more preferably about 99% by weight copolymer, and even more preferably about 100% by weight copolymer, based upon the total solids in the composition taken as 100% by weight. That is, the composition will preferably be substantially free of other ingredients dispersed or dissolved in the solvent system with the copolymer.

In an alternative embodiment, the component used to form the protective composition is an aromatic sulfone polymer. The composition thus comprises an aromatic sulfone polymer dispersed or dissolved in a solvent system. Suitable aromatic sulfone polymers are selected from the group consisting of polysulfones, polyethersulfones, polyphenylsulfones, and combinations thereof. Preferred aromatic sulfone polymers will comprise recurring monomers having the formula

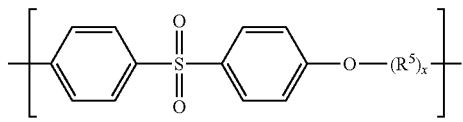

(VI)

where x is 0 or 1, and each $R^5$ is selected from the group consisting of

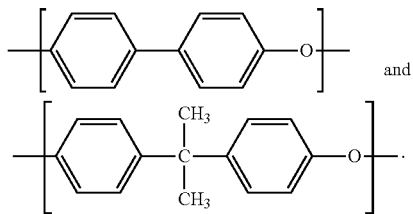

and

The aromatic sulfone polymer preferably has a weight average molecular weight of greater than about 30,000 Daltons, and more preferably from about 50,000 Daltons to about 200,000 Daltons. In some embodiments, the polymer consists essentially (or even consists) of recurring monomers having the formula (VI). Thus, the polymer is preferably substantially free of other co-monomers.

The protective composition is formed by dispersing or dissolving the aromatic sulfone polymer in a solvent system. In this embodiment, the solvent system utilized in the composition should have a boiling point of from about 100 to about 220° C., and preferably from about 140 to about 180° C. The solvent system should be utilized at a level of from about 60 to about 95% by weight, preferably from about 65 to about 90% by weight, and more preferably from about 70 to about 85% by weight, based upon the total weight of the composition taken as 100% by weight. The total solids in the composition is preferably from about 5 to about 40% by weight, more preferably from about 10 to about 35% by weight, and even more preferably from about 15 to about 30% by weight, based upon the total weight of the composition taken as 100% by weight. Suitable solvent systems will comprise a solvent selected from the group consisting of ketones, polar aprotic solvents, and mixtures thereof. Especially preferred solvents within these categories include cyclopentanone, tetramethyl urea, dimethyl acetamide (DMAC), dimethyl sulfoxide (DMSO), and dimethyl formamide (DMF). Coating properties can be varied by including a co-solvent in the solvent system. Suitable co-solvents are selected from the group consisting of aromatic solvents, EAA, and mixtures thereof. The aromatic sulfone polymer should be present in the composition at a level of from about 5 to about 40% by weight, preferably from about 10 to about 35% by weight, and even more preferably from about 15 to about 30% by weight, based upon the total weight of the composition taken as 100% by weight. It will be appreciated that the sulfone polymer solids level can be varied depending on the copolymer molecular weight, desired solution viscosity, and solvent type.

Although other ingredients can be dispersed or dissolved in the solvent system with the aromatic sulfone polymer, in some aspects, it is preferred that the composition consist essentially (or even consist) of the aromatic sulfone polymer dispersed or dissolved in the solvent system. Thus, the composition will preferably comprise from about 90 to about 98% by weight aromatic sulfone polymer, more preferably about 99% by weight aromatic sulfone polymer, and even more preferably about 100% by weight aromatic sulfone polymer, based upon the total solids in the composition taken as 100% by weight. That is, the composition will preferably be substantially free of other ingredients dispersed or dissolved in the solvent system with the aromatic sulfone polymer.

Regardless of the embodiment, the protective compositions are preferably non-crosslinkable. That is, although it will be appreciated that trace amounts of crosslinking may occur during baking (curing) of the composition, for example, as a result of film oxidation and subsequent side reactions, crosslinking is preferably avoided to the extent possible. More preferably the composition is substantially free of crosslinking agents and compounds that promote crosslinking, such as vinyl ethers, glycolurils, melamines, epoxies, and acrylates. Furthermore, it is preferred that the layer formed from the composition be nonconductive. The protective layer should also be non-photosensitive (i.e., it does not undergo a physical or chemical change upon exposure to light). More specifically, a pattern preferably cannot be defined in the layer when it is exposed to about 1 J/cm². Thus, the layer is also preferably formed from a composition that is substantially free of photoacid generators and photoinitiators. The term "substantially free," as used herein, refers to an ingredient or co-monomer being present in the composition or polymer at a level of less than about 0.05% by weight, more preferably less than about 0.01% by weight, and even more preferably about 0% by weight, based upon the total weight of the composition or polymer taken as 100% by weight. The protective coating should also be non-alkaline soluble (i.e., alkaline resistant), meaning that it is substantially (i.e., less than about 0.5% by weight) insoluble in an aqueous solution having a pH of greater than about 8, and preferably greater than about 10.

In use, the protective composition is applied to a substrate surface, preferably by spin coating at about 500 to about 5,000 rpm (and preferably from about 500 to about 1,500 rpm) for about 30 to about 90 seconds. The substrate can include one or more optional intermediate layers, such as etch stop layers, mask layers, primer layers, etc., in which case the protective composition would be applied to the intermediate layer. Preferred substrates include device wafers. The substrate preferably comprises a device surface and a backside surface. The device surface of these substrates commonly comprises device features (topography, such as raised structures and lines). Advantageously, the solvent-based composition can be applied via spin-coating, resulting in little to no stress on the device features during formation of the protective layer. Device features include structures formed in and on the substrate surface from one or more of the following materials: silicon, polysilicon, silicon dioxide, silicon (oxy)nitride, metals (e.g., copper, aluminum, gold, tungsten, tantalum, solder alloys), low-k dielectrics, polymer dielectrics, and various metal nitrides and silicides. Exemplary device features include raised structures and circuitry, such as solder bumps and joints, posts, pillars, and lines formed of conducting material (e.g., patterned conducting material, such as copper). Preferred substrates for use in this process include those selected from the group consisting of Si substrates, $SiO_2$ substrates, $Si_3N_4$ substrates, $SiO_2$ on silicon substrates, $Si_3N_4$ on silicon substrates, glass substrates, quartz substrates, ceramic substrates, semiconductor substrates, and metal microelectronic substrates.

The resulting layer is soft-baked at a temperature from about 80° C. to about 150° C. (and preferably from about 120° C. to about 150° C.) for about 60 to about 180 seconds to evaporate solvents. The dried layer is then subjected to a final bake at a temperature of from about 130° C. to about 250° C. (and preferably from about 170° C. to about 225° C.) for about 60 to about 180 seconds (and preferably from about 90 to about 120 seconds) to yield the protective coating or layer. The preferred process for baking styrene-acrylonitrile-based coatings is to bake at a temperature of about 140° C. for about 120 seconds, followed by baking a temperature of about 205° C. for about 60 seconds.

The preferred process for baking aromatic sulfone-based coatings is to bake at a temperature of about 100° C. for about 120 seconds, followed by baking at a temperature of about 230° C. for about 120 seconds. In either embodiment, the protective coating preferably has a thickness (as measured by an ellipsometer over 5 different points) of from about 5 to about 20 µm, and preferably from about 10 to about 15 µm, depending upon the degree of coverage required over device features and topography on the substrate. The protective coating is preferably applied at a thickness sufficient to substantially cover and planarize the substrate topography at these thicknesses. More specifically, the protective composition is preferably applied at a thickness sufficient to provide a protective coating over raised devices features of at least about 3 µM, and preferably from about 5 to about 10 µm. The coating preferably has a thickness variation of less than about 20%, and more preferably less than about 10% over a distance of about 10,000 µm. The protective coating will have excellent adhesion to the substrate surface without the use of a primer layer. Thus, structures formed using the protective coating can be free of any intermediate layers, such as primer layers.

The coated substrate can then be subjected to backside processing. Examples of backside processing include dry etching (e.g., DRIE), wet etching (e.g., to create through-silicon-vias, "TSV's," by wet processes or remove backside hard masks), wet cleaning (e.g., to remove photoresists and associated residues), wafer-thinning (e.g., back-grinding), chemical-mechanical polishing (CMP), lithographic patterning passivation and annealing (e.g., baking to 270° C.+ to solidify structures), metal and dielectric deposition, which includes chemical vapor deposition (CVD), physical vapor deposition (PVD), electroplating (particularly of copper), as well as coating and curing of polymer dielectrics such as benzocyclobutene (BCB) and polyimides. Combinations of the above processes can also be used. In particular, the substrate can be secured to a chuck with the protective layer adjacent the chuck surface. The substrate can be held in place by any suitable means including vacuum force, electrostatic force, adhesive, etc. The backside of the substrate is then processed as described.

FIG. 1(A)-(C) depicts the general use of the protective compositions during dry processing; however, it will be appreciated that the same general procedure can be used for any type of backside processing. The DRIE processing steps are as follows. A substrate 10 having a device surface 12 and a backside surface 14 is provided. Device features 16, such as complementary metal oxide semiconductor (CMOS) or MEMS circuitry, are created on the front (device) surface 12 of the substrate 10, along with an optional etch stop layer 18. A layer 20 of the protective coating material is applied to the device surface 12 covering the device features 16 and planarizing the substrate 10 topography. Advantageously, the protective layer 20 can also serve as an etch stop layer, making the use of a separate etch stop layer 18 in the device design unnecessary. In addition, unlike the use of an etch stop layer alone, the protective layer 20 also provides the advantage of protection from punch-through yield loss, if the dry etchant penetrates the etch stop layer 18 through over etching. Once the protective layer 20 is formed, the substrate 10 is then inverted. An optional mask layer 22 is applied to the backside 14 of the substrate 10. The substrate 10 is placed in a DRIE tool with the protective layer 20 adjacent the DRIE chuck (not shown). Via or trench features 24 are then formed in the backside 14 of the substrate 10 using DRIB. DRIE is particularly suited for forming TSV's.

The protective layer is also suitable for use in CVD or PVD processes. Use of the protective coating in a CVD process is similar to that described in detail for DRIB. The device wafer is placed face down on a chuck in a reactor system with the protective coating adjacent the chuck, and deposition takes place on the backside under very low pressure conditions. A plasma can be generated in the reactor chamber to aid with deposition. As a result, the temperature of the device wafer is often increased above the chamber temperature. For example, during backside deposition of silicon dioxide into TSV's, the wafer surface temperature can increase to about 250°-280° C., even though the chamber temperature might be fixed at a lower temperature such as 180° C. Materials commonly deposited by CVD include silicon dioxide, silicon nitride, and related oxynitrides.

PVD processes include both sputtering and evaporation processes, and take place under very low pressure in a chamber system which can utilize a wafer chuck. For sputtering, a target made of metal or a dielectric material is bombarded with high energy atoms or molecules, which causes the target material to vaporize and then deposit on the backside of the device substrate. For evaporative deposition, a crucible filled with metal such as aluminum, for example, is typically heated with an electron beam, causing it to vaporize and then deposit on the device substrate. PVD (sputtering) is a primary way of depositing copper seed layers inside TSV's. Copper is then electroplated from the seed layer to fill the TSV and form an electrical connection. In both processes, the protective coating protects the device surface features from damage.

Regardless of the process in which it is used, the protective coating will be resistant to scratches, and preferably will have a pencil hardness of at least 3H, more preferably at least about 5H and even more preferably from about 7H to about 9H, as measured by ASTM method D3363, described herein. The protective coating will also be resistant to chemical etchants and lift off. The protective coating also will withstand temperatures well in excess of 300° C., such as those experienced during a backside DRIE etch. That is, the protective coating will not outgas/sublime (decompose) at temperatures from about 100° C. to about 300° C., and preferably from about 200° C. to about 280° C. The protective coating will also not reflow under these temperatures. This avoids problems associated with melting of the protective layer during processing and sticking to the chuck. Likewise, the protective coating also will not undergo any side reactions under these temperatures, maintaining its initial solvent solubility for easy removal. The protective coating will preferably have a glass transition temperature of at least about 100° C., more preferably from about 110° C. to about 250° C., and even more preferably from about 115° C. to about 230° C. The coating will also preferably contain less than about 50 ppb of ions such as Fe, Na, K, Ca, and Cu.

Furthermore, cured coatings or films having a thickness of from about 5 µm to about 20 µm will have a percent transmittance of at least about 85%, preferably at least about 90%, and even more preferably from about 95% to about 98% at wavelengths of from about 400 to about 700 nm.

Regardless of the embodiment, once backside processing is complete, the protective coating can be easily removed from the device surface using a solvent. The protective coating is preferably contacted with the solvent for a time period of from about 10 minutes to about 60 minutes, and more preferably from about 20 minutes to about 30 minutes until removed. A solvent bath is particularly suitable for the removal process. Manual agitation and heating of the bath can be used to facilitate removal. Suitable solvents are selected from the group consisting of ketones, esters, aromatic solvents, aprotic polar solvents, and commercial photoresist strippers (e.g., those containing N-methylpyrrolidone (NMP), and the like), and mixtures thereof. Advantageously, the protective coating is easily removable from the substrate surface without damaging any device features on the surface.

EXAMPLES

The following examples set forth preferred methods in accordance with the invention. It is to be understood, however, that these examples are provided by way of illustration and nothing therein should be taken as a limitation upon the overall scope of the invention.

Example 1

Formulation of a Coating Composition Using a Copolymer of Styrene and Acrylonitrile (SAN)

A protective coating composition was formulated by dissolving 25 grams of SAN30 (poly(styrene-co-acrylonitrile), Mw=185,000, 30% (w/w) acrylonitrile content; Aldrich, St. Louis, Mo.) in 37.5 grams of 2-(1-methoxy)propyl acetate (PGMEA) (Ultra Pure Solutions Inc., Castroville, Calif.) and 37.5 grams of ethyl acetoacetate (EAA; Harcros Chemicals Inc., Kansas City, Kans.). The resulting SAN solution was filtered twice using a 0.2/0.45-µm polypropylene filter.

Example 2

Use of Protective Coating During Device Fabrication

The protective coating from Example 1 was spin-applied, using a Sokudo/DNS system, onto silicon wafers using the following steps:
1. 100 rpm, 1,000 rpm/s acceleration, for 2 seconds.
2. 100 rpm, 1,000 rpm/s acceleration, for 9 seconds (manual dispense).
3. 1,000 rpm, 1,000 rpm/s acceleration, for 45 seconds.
The resulting films had a thickness of 14 µm (goodness of fit=0.98).

The wafers were baked (proximity mode) in a track system at 140° C. for 120 seconds and then at 205° C. for 60 seconds. The wafers underwent DRIE on three different etch tools (LAM; Pegasus; and AVIZA) using identical conditions to identify if material performance was affected by different tool sets. Etch conditions (BOSCH process) were identical for each tool as follows:

| | |
|---|---|
| $SF_6$ flow rate | 30-150 sccm |
| $C_4F_8$ flow rate | 20-100 sccm |
| Etch cycle | 5-15 seconds |
| Deposition cycle | 5-12 seconds |
| Pressure | 10-50 mTorr (preference 30 mTorr for $SF_6$, and 35 mTorr for $C_4F_8$) |
| Power | 300-600 Watts |
| Chamber temperature | 140° C. |
| Chuck temperature | 10° C. |
| Total etch duration | 50 minutes + 10 minute over-etch |

The protective coating resisted scratching in the DRIE chambers. No backside devices were affected during the etch process. The protective coating acted as an etch stop in the various etch tools.

The coating was removed using a bath of methyl isoamyl ketone (20- to 30-minute soak with manual agitation) and a subsequent isopropyl alcohol rinse. Photos and roughness measurements showed that no protective coating residue remained after the removal process.

Example 3

Hardness Test of a SAN Protective Coating

In this Example, the pencil hardness of a SAN protective coating composition was tested. A 25% solids SAN formulation was prepared by dissolving SAN30 copolymer in a 70%/30% w/w solvent system of PGMEA and EAA, followed by filtering.

The coating was static dispensed onto two silicon wafers, followed by spinning at 1,000 rpm for 60 seconds, using a 10,000 rpm/s acceleration rate. The coating was then baked at 140° C. for 2 minutes, followed by 205° C. for 1 minute. Pencil hardness of the resulting film was then tested using ASTM D3363. The ASTM testing kit contained pencils of different hardness levels ranging from 6B (softest) to 9H (hardest). For each test, a pencil was loaded into the tester and then run across the surface of the protective coating using approximately 300 g of force. The hardness of the film was then determined by the softest pencil to make a scratch in the film. The coating had an ASTM D3363 pencil hardness of greater than 9H, as none of the pencils in the kit scratched the film.

Example 4

Glass Transition Temperature of a SAN Protective Coating

Figure 2:
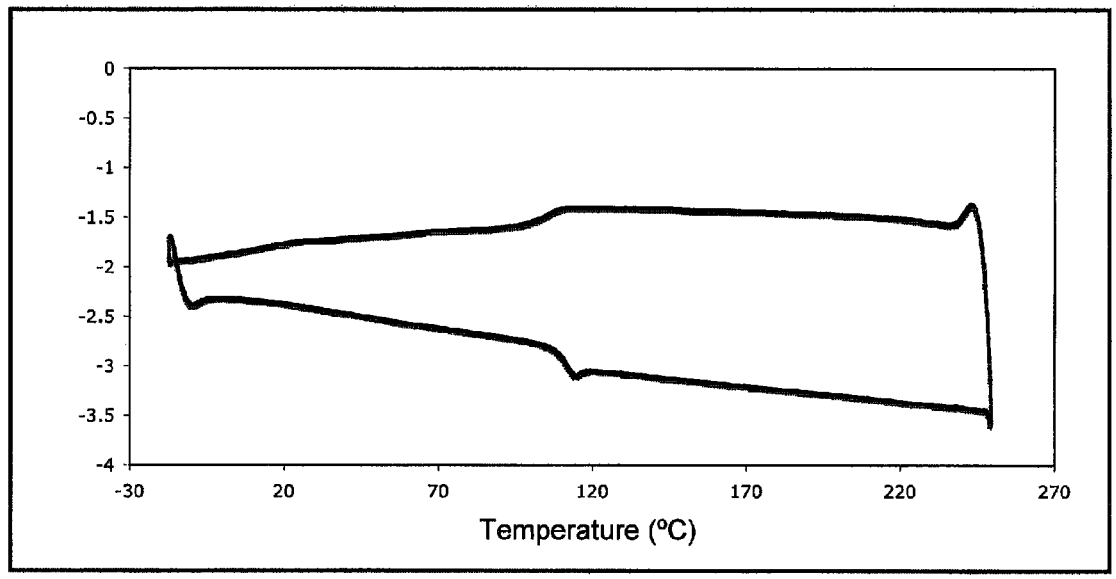
FIG. 2 is a graph showing the glass transition temperature testing of the styrene-acrylonitrile copolymer coating in Example 4.

The composition prepared in Example 3 was spin-coated onto silicon wafers at 1,500 rpm for 90 seconds. The resulting layer was then baked at 100° C. for 2 minutes, at 150° C. for 2 minutes, and then at 205° C. for 1 minute. The resulting protective coating was then scraped off the wafers for thermal analysis using a DSC 2920 (TA Instruments). The following test parameters were used: (1) Begin at room temperature, and then ramp up to 250° C. at 10° C./min., followed by a cool down to −30° C. at 10° C./min. (2) This heating and cooling cycle was then repeated, and the glass transition temperature of the sample was analyzed during the second heating and cooling cycle. The coating had a glass transition temperature of 117.4° C. (see FIG. 2), which is well above typical DRIE process temperatures indicating that the material will not reflow or stick to the DRIE chuck.

Example 5

Thermogravimetric Analysis (TGA) of a SAN Protective Coating

Figure 3:
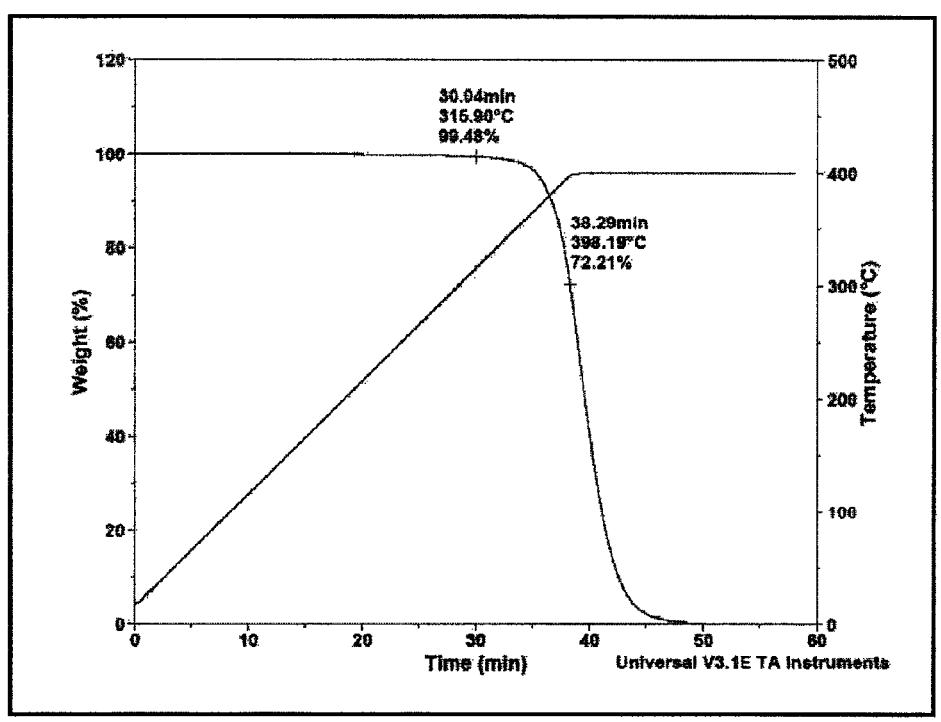
FIG. 3 is graph of the thermogravimetric analysis (TGA) results from Example 5.

A protective composition prepared as in Example 3 was analyzed for outgassing using a Universal V3.1E (TA Instruments). The protective composition was spin-applied to two silicon wafers by dispensing onto the wafers, followed by spinning at 1,000 rpm for 60 seconds, using a 10,000 rpm/s acceleration rate. The samples were submitted for TGA under the following conditions: $N_2$ environment, up to 400° C. at 10° C./min., followed by holding at 400° C. for 20 minutes. The weight loss of each sample was measured throughout the process. As shown in FIG. 3, there was very minimal weight loss up to 315° C. (0.52%). All of the samples vaporized at 400° C.

Figure 4:
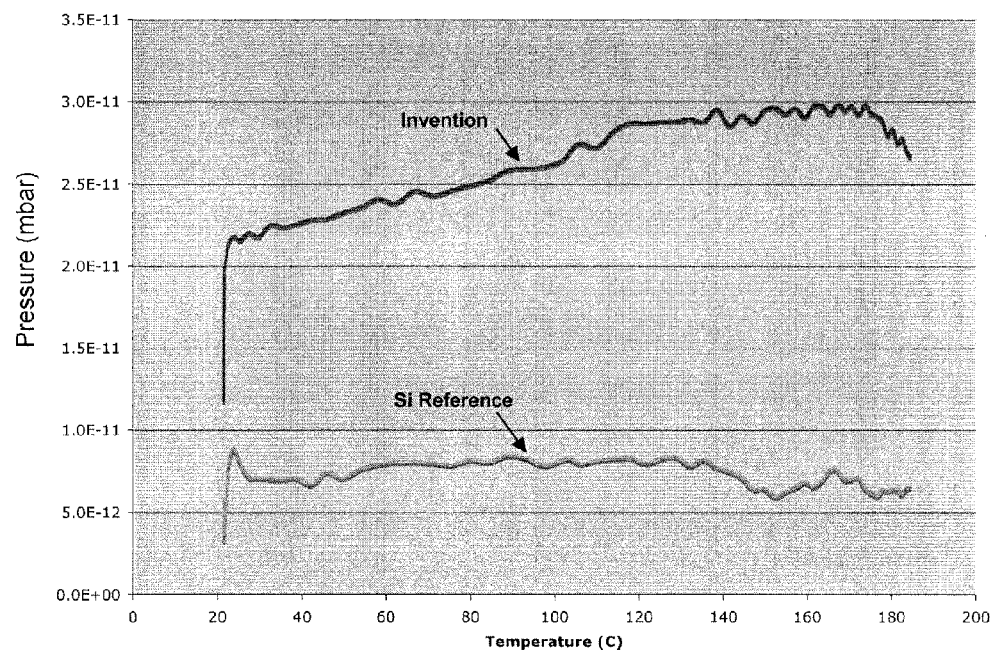
FIG. 4 is a graph of the vacuum outgas testing from Example 5.
Figure 5:
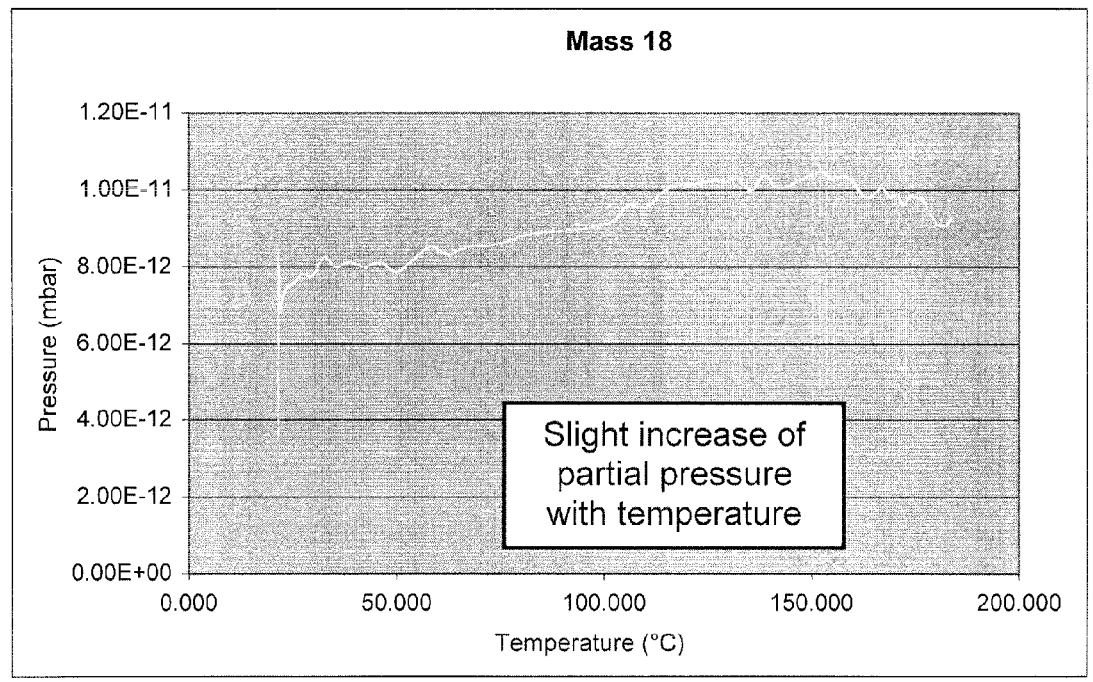
FIG. 5 is a graph of the outgassed species under vacuum from Example 5.

For vacuum outgas testing, a protective composition prepared as in Example 3 was spin-coated onto silicon wafers at 1,500 rpm for 90 seconds. The coating was then baked at 100° C. for 2 minutes, at 150° C. for 2 minutes, and then at 205° C. for 1 minute. The wafers were then cut into 7×7 $cm^2$ squares for use with the outgassing chuck. The outgassing rate of a blank silicon wafer was used as the control. The outgassing rate of the protective coating was determined as a function of temperature using a 40-L outgassing vacuum chamber and a 0-200 MKS mass spectrometer with a sensitivity to $10e^{-14}$ mbar. The chamber was at $1.7e^{-7}$ mbar when introducing each sample. Full acquisition (0-200 amu) was taken every 90 seconds. The total pressure outgassed by each sample was obtained by summing all partial pressure measurements taken at each temperature step (every 90 seconds). As shown by the results in FIG. 4, the protective coating had a very low outgassing rate with temperature. The total pressure only increased from $1.84e^{-11}$ to $2.7e^{-11}$ mbar. There was no significant outgassing at ambient temperature. As shown in FIG. 5, only a few outgassed species were noted up to 185° C. There was visible partial pressure increase for 12, 18, and 44 amu only. The protective coating ion levels are shown in the Table in FIG. 6.

Example 6

Preparation of a San Terpolymer and Formulation of a Protective Composition from the Terpolymer A terpolymer of styrene, acrylonitrile, and butyl acrylate was prepared in this example. Styrene was purified by passing through an aluminum oxide column. Acrylonitrile was purified by washing sequentially with a 5% by weight $H_2SO_4$ solution, a 5% by weight NaOH solution, and water to remove inhibitors and amine impurities that might cause crosslinking of the polymer. It was dried over anhydrous calcium chloride and then 4-Å molecular sieves. Butyl acrylate was purified by passing through a column of aluminum oxide.

A mixture of purified monomers including 30 g of styrene, 15 g of acrylonitrile, and 5 g of butyl acrylate was polymerized in PGMEA, and the polymer was recovered using a 0.2/0.45-μm polypropylene filter. The conversion or the yield of the polymerization for this system was around 80%. GPC molecular weight ($M_w$) for this polymer was around 99,600 g/mole (relative to a polystyrene standard).

The protective composition (15% solids) was prepared by dissolving 15 g of the recovered dry polymer in 76.5 g of PGMEA and 8.5 g of ethyl lactate. It was filtered twice using a 0.2/0.45-μm polypropylene filter.

Example 7

Formulation of a Polyethersulfone Protective Composition

A protective coating composition was formulated by adding 30 grams of RADEL® A-704 polyethersulfone (now available under the tradename VERADEL®; Solvay Advanced Polymers, Alpharetta, Ga.) to a 125-mL amber plastic bottle along with 70 mL of DMAC. The mixture was left on a wheel to mix overnight. The resulting mixture was filtered using a Meisner 0.2 μm vanguard bubble filter.

Example 8

Spin Coating of a Wafer Using a Polyethersulfone Composition

A sample of 30% solids RADEL® A-704 in DMAC was prepared as in Example 7. This composition was then spin-coated onto a 4-inch silicon wafer at 800 rpm for 60 seconds, followed by baking on a hotplate at 100° C. for 2 minutes. The coat quality was good, and a film thickness of 16.87 μm was obtained. The wafer was then baked at 230° C. for 2 minutes, resulting in a film thickness of 14.14 μm. There was no smoke.

A second sample of 30% solids RADEL® A-704 in DMAC was prepared as in Example 7. This composition was then spin-coated onto a 4-inch silicon wafer at 1000 rpm for 60 seconds, followed by baking on a hotplate at 100° C. for 2 minutes. The wafer was then baked at 230° C. for 2 minutes, resulting in a final film thickness of 11.16 μM.

Example 9

Thermogravimetric Analysis of a Polyethersulfone Coating

Figures 6, 7:
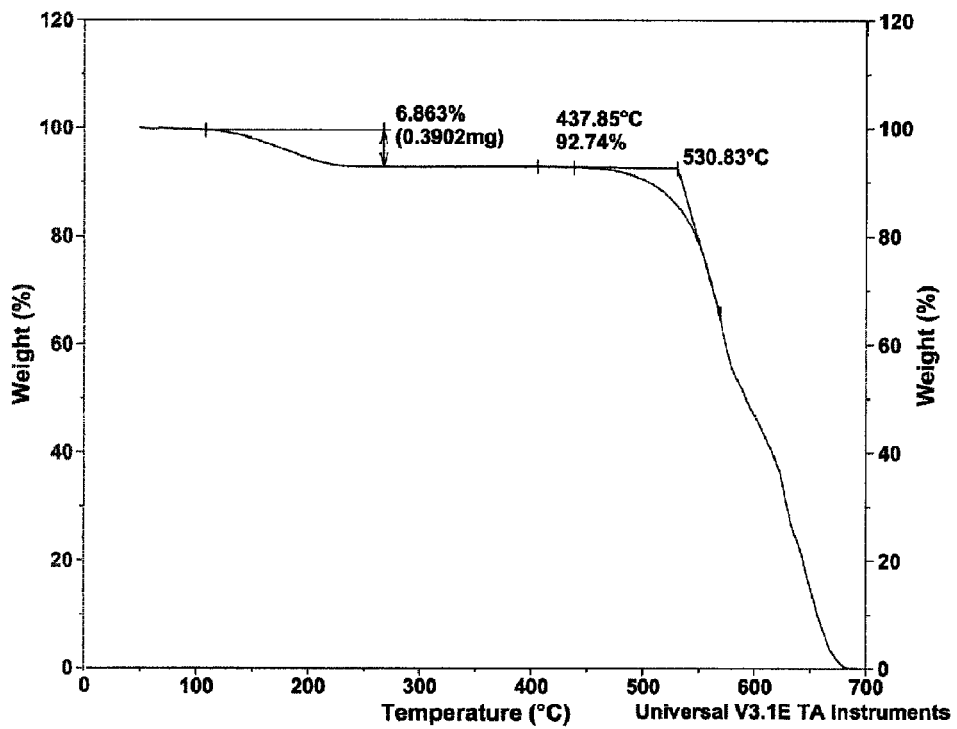
FIG. 6 is a table showing the film ion levels from Example 5.
FIG. 7 is a graph of the TGA results of the polyethersulfone coating from Example 9.

A sample of 30% solids RADEL® A-704 in DMAC was prepared as in Example 7. This composition was spin-coated onto a 4-inch silicon wafer at 1,000 rpm for 60 seconds, followed by baking on a hotplate at 100° C. for 2 minutes. The wafer was then submitted for thermogravimetric analysis. The chart in FIG. 7 shows the resulting data. The film experienced a loss in weight at around the glass transition temperature of about 220° C., but then remained steady until about 440° C., with a major loss not occurring until after 500° C. This thermal stability would enable the coating to withstand the high temperatures present during an etch process.

Example 10

Adhesion Analysis of a Silicon Wafer to a Dried Polyethersulfone Coating

A sample of 30% solids RADEL® A-704 in DMAC was prepared as in Example 7. This composition was spin-coated onto a 4-inch silicon wafer at 1,000 rpm for 60 seconds, followed by baking on a hotplate at 100° C. for 2 minutes. The wafer was then heated to 200° C., and a clean test wafer was placed on top of the coated wafer. The wafers did not stick to one another.

A second sample of 30% solids RADEL® A-704 in DMAC was prepared as in Example 7. This composition was spin-coated onto a 4-inch silicon wafer at 1,000 rpm for 60 seconds, followed by baking on a hotplate at 100° C. for 2 minutes. The wafer was then heated to 230° C., and a clean test wafer was placed on top of the coated wafer. There was only slight sticking between the wafers.

Example 11

Hardness Test of a Polyethersulfone Coating

A sample of 30% solids RADEL® A-704 in DMAC was prepared as in Example 7. This composition was spin-coated onto a 4-inch silicon wafer at 800 rpm for 60 seconds, followed by baking on a hotplate at 100° C. for 2 minutes. The wafer was then baked at 230° C. for 2 minutes. The coat quality was good, and a film thickness of 16.87 μm was obtained. The hardness of the coating was checked using ASTM method D3363. There was no damage at 7H.

Example 12

% Transmittance and Refractive Index

Figure 8:
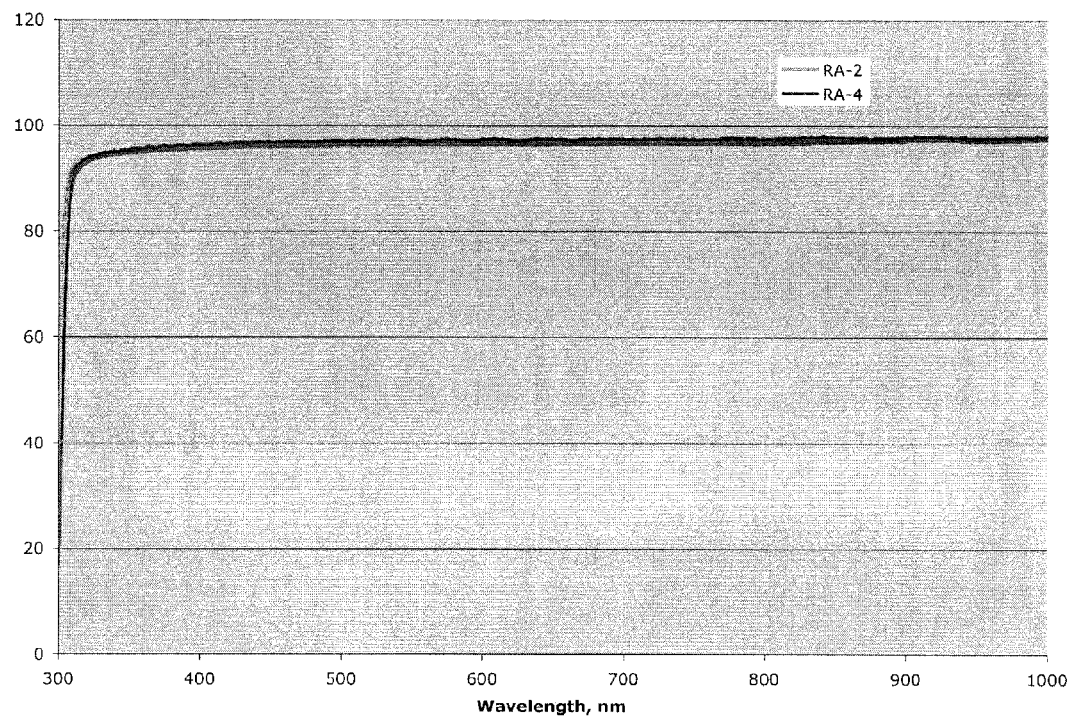
FIG. 8 is a graph showing the % transmittance of the polyethersulfone coating from Example 13.
Figure 9:
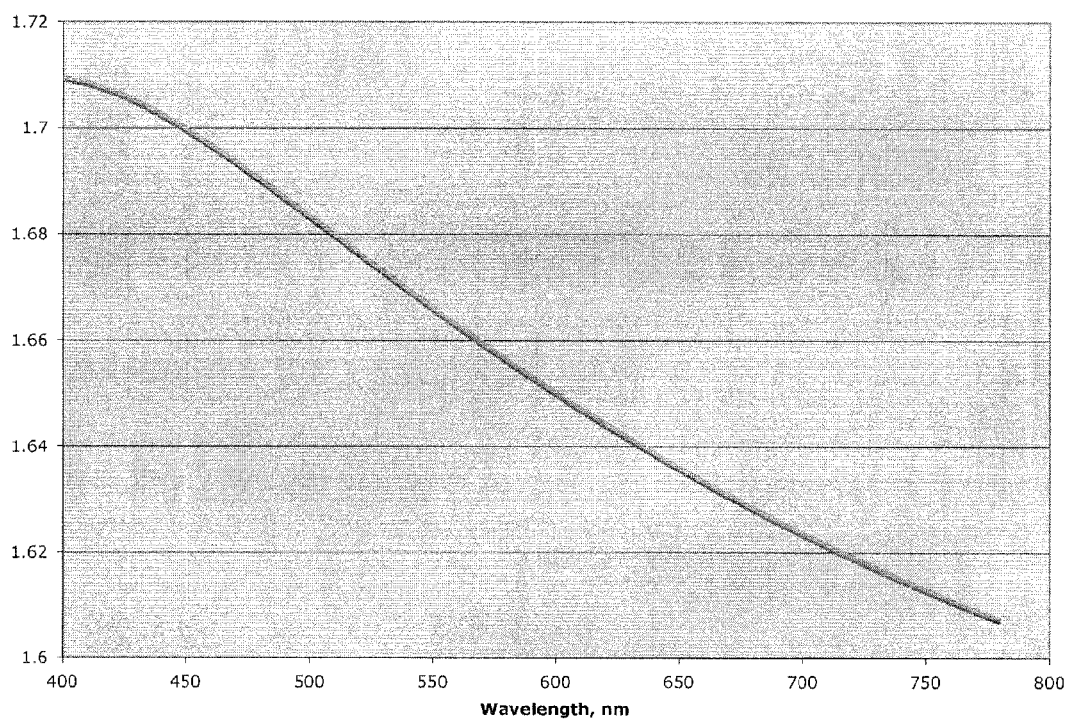
FIG. 9 is a graph showing the refractive index of the polyethersulfone coating from Example 13.

An 11% solids solution of RADEL® A-704 in DMSO was prepared and filtered through a 1.0 μm filter. The resulting mixture was spin-coated onto a 2-inch glass substrate at 1,000 rpm for 1 minute, at an acceleration rate of 1,000 rpm/min., followed by baking on a hotplate at 100° C. for 2 minutes and then at 145° C. for 3 minutes. A 25% solids solution of RADEL® A-704 in DMAC was also prepared and filtered through a 1.0 μm filter. The resulting mixture was spin-coated onto a 2-inch glass substrate at 1,000 rpm for 1 minute, at an acceleration of 1,000 rpm/min., followed by baking on a hotplate at 100° C. for 2 minutes and then at 145° C. for 3 minutes. The % transmittance and refractive index of each resulting film was then measured using a spectrophotometer (Varian Model Cary 500) and prism coupler (Metricon Model 2010). The results are shown in FIGS. 8 and 9.

Example 13

Solubility Testing of Polyethersulfone

In this Example, the solvent solubility of RADEL® A-704 was tested using different solvents and different solids levels. The results are shown in Table 1 below.

TABLE 1

Solubility Study

| | 10% solids | 20% solids | 30% solids |
|---|---|---|---|
| acetone | — | not soluble | — |
| MIAK | — | not soluble | — |
| DMAC | good | good | good |
| DMSO | good | good | good |
| EAA | — | not soluble | — |
| methyl isobutyl ketone | — | not soluble | — |
| cyclopentanone | good | gels | gels |
| PGME | not soluble | — | — |
| ethyl lactate | not soluble | — | — |

We claim:
1. A method of protecting a device surface, said method comprising:
providing a substrate having a device surface and a backside surface;
optionally forming one or more intermediate layers on said device surface;
forming a non-photosensitive protective layer on said intermediate layers if present, or on said device surface is no intermediate layers are present, said protective layer being formed from a composition comprising a component dispersed or dissolved in a solvent system, said component being selected from the group consisting of styrene-acrylonitrile copolymers and aromatic sulfone polymers;
providing a chuck having a surface;
securing said substrate to said chuck with said protective layer adjacent said chuck surface; and
subjecting said backside surface to backside processing.

2. The method of claim 1, wherein said backside processing is selected from the group consisting of dry etching, wet etching, wet cleaning, wafer-thinning, chemical-mechanical polishing, metal and dielectric deposition, lithographic patterning passivation and annealing, and combinations thereof.

3. The method of claim 1, further comprising removing said protective layer from said device surface via solvent removal.

4. The method of claim 1, wherein said device surface comprises device features selected from the group consisting of structures formed from silicon, polysilicon, silicon dioxide, silicon (oxy)nitride, metals, low-k dielectrics, polymer dielectrics, metal nitrides and silicides, and combinations thereof.

5. The method of claim 4, wherein said protective layer is formed on said device surface at a thickness sufficient to cover said device features.

6. The method of claim 1, wherein said protective layer has a pencil hardness of at least about 3H.

7. The method of claim 1, wherein said protective layer has a glass transition temperature of at least about 110° C.

8. The method of claim 1, wherein said backside processing is selected from the group consisting of deep reactive ion etching, chemical vapor deposition, physical vapor deposition, and combinations thereof.

9. The method of claim 1, wherein said component is a styrene-acrylonitrile copolymer comprising recurring monomers having the formula

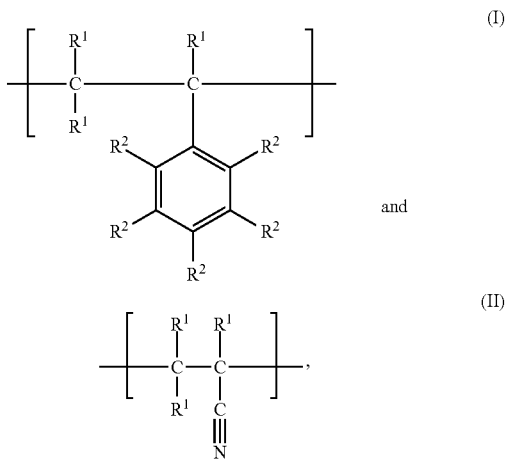

wherein:
each $R^1$ is individually selected from the group consisting of —H and $C_1$-$C_8$ alkyls; and
each $R^2$ is individually selected from the group consisting of —H, $C_1$-$C_8$ alkyls, and $C_1$-$C_8$ alkoxys.

10. The method of claim 9, wherein said copolymer is substantially free of other co-monomers.

11. The method of claim 9, wherein said solvent comprises a solvent selected from the group consisting of ketones, esters, glycol ethers, aromatic hydrocarbons, ethers, and mixtures thereof.

12. The method of claim 1, wherein said component is an aromatic sulfone polymer comprising recurring monomers having the formula

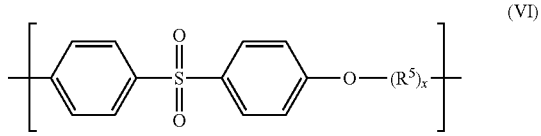

where x is 0 or 1, and each $R^5$ is selected from the group consisting of

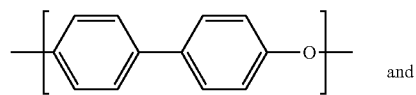 and

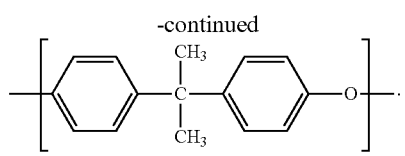.

13. The method of claim 12, wherein said polymer consists essentially of recurring monomers having formula (VI).

14. The method of claim 12, said solvent system comprises a solvent selected from the group consisting of ketones, polar aprotic solvents, aromatic solvents, ethyl acetoacetate, and mixtures thereof.

15. The method of claim 1, wherein said composition comprises from about 5 to about 40% by weight of said component, based upon the total weight of the composition taken as 100% by weight.

16. The method of claim 1, wherein said composition consists essentially of said component dispersed or dissolved in said solvent system.

17. The method of claim 1, wherein said protective layer chemically and mechanically protects said device surface during said backside processing.

18. The method of claim 1, wherein said protective layer is scratch-resistant.

19. The method of claim 1, wherein said protective layer can withstand backside processing temperatures greater than 300° C.

\* \* \* \* \*